United States Patent [19]

Hartman et al.

[11] Patent Number: 4,663,815

[45] Date of Patent: May 12, 1987

[54] A METHOD AND APPARATUS FOR SURFACE MOUNT COMPATIBLE CONNECTOR SYSTEM WITH MECHANICAL INTEGRITY

[75] Inventors: John E. Hartman, Painesville; John T. Venaleck, Madison, both of Ohio

[73] Assignee: Associated Enterprises, Inc., Painesville, Ohio

[21] Appl. No.: 782,351

[22] Filed: Oct. 1, 1985

Related U.S. Application Data

[63] Continuation-in-part of Ser. No. 747,343, Jun. 21, 1985.

[51] Int. Cl.$^4$ ............................................. H05K 3/30
[52] U.S. Cl. ..................................... 29/839; 83/620; 83/621; 228/56.3; 228/248; 339/17 M
[58] Field of Search ................ 29/837, 839, 840, 843, 29/845; 228/56.3, 180.1, 180.2, 248, 255; 83/620, 621; 339/17 C, 176 MP, 198 G, 198 H, 275 R, 275 B

[56] References Cited

U.S. PATENT DOCUMENTS

| | | | |
|---|---|---|---|
| 2,776,008 | 1/1957 | Soderman | 83/620 X |
| 3,462,540 | 8/1969 | Harris, Jr. et al. | 339/17 E X |
| 3,568,554 | 3/1971 | Wiechec | 83/621 X |
| 3,591,922 | 7/1971 | Pardee et al. | 339/17 M |
| 3,822,622 | 7/1974 | Smith et al. | 83/621 X |

FOREIGN PATENT DOCUMENTS 54-4846 1/1979 Japan .................................. 228/255

Primary Examiner—Howard N. Goldberg
Assistant Examiner—Carl J. Arbes
Attorney, Agent, or Firm—Renner, Otto, Boisselle & Lyon

[57] ABSTRACT

An electrical component for mechanical mouting and electrical connection with respect to plated through holes of a printed circuit board compatibly with a surface mount attaching process includes an electrically non-conducting body, plural generally elongate contacts extending from the body for insertion into such plated through holes, and the component having a reservoir for retaining solder type material for melting, for flow into respective plated through holes, and for re-solidifying to mechanically and electrically couple the component to such printed circuit board. Preferably the component is a connector, such as a header, and the contact pins or leads thereof provide an interface connection between the printed circuit board and a separate or portable connector.

A method for attaching such an electrical component to a printed circuit board compatibly with surface mount attaching processes, a method for placing solder in the reservoirs of such electrical component, and apparatus to carry out such methods also are part of the invention.

11 Claims, 20 Drawing Figures

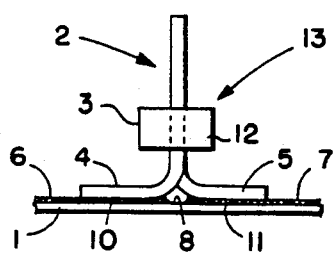
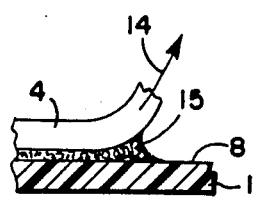
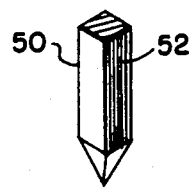
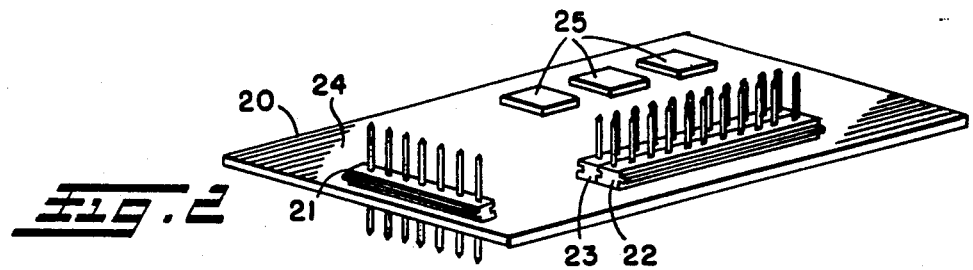
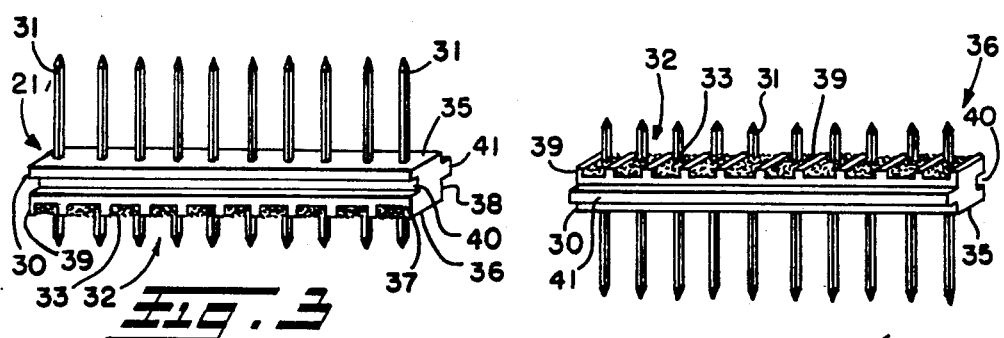
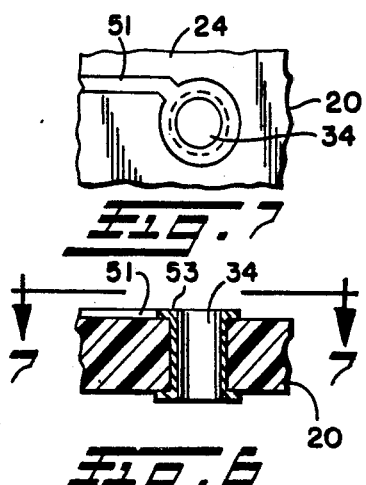
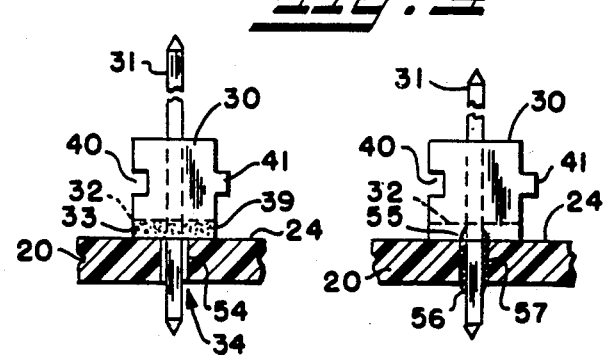

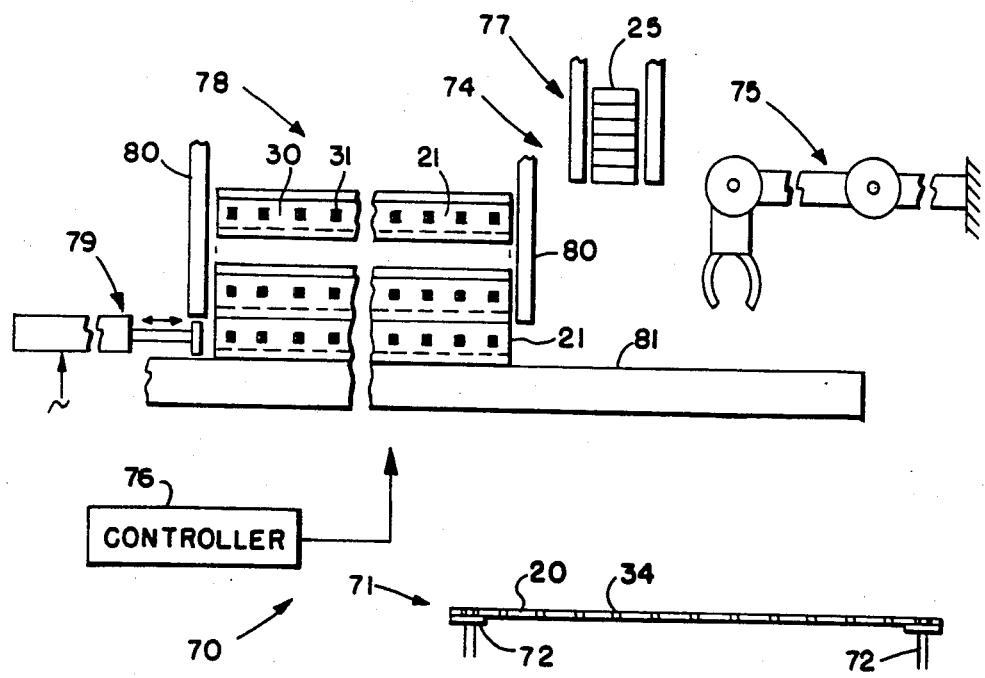
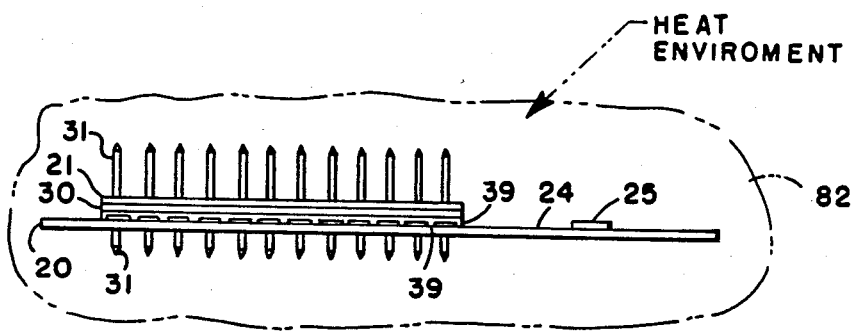

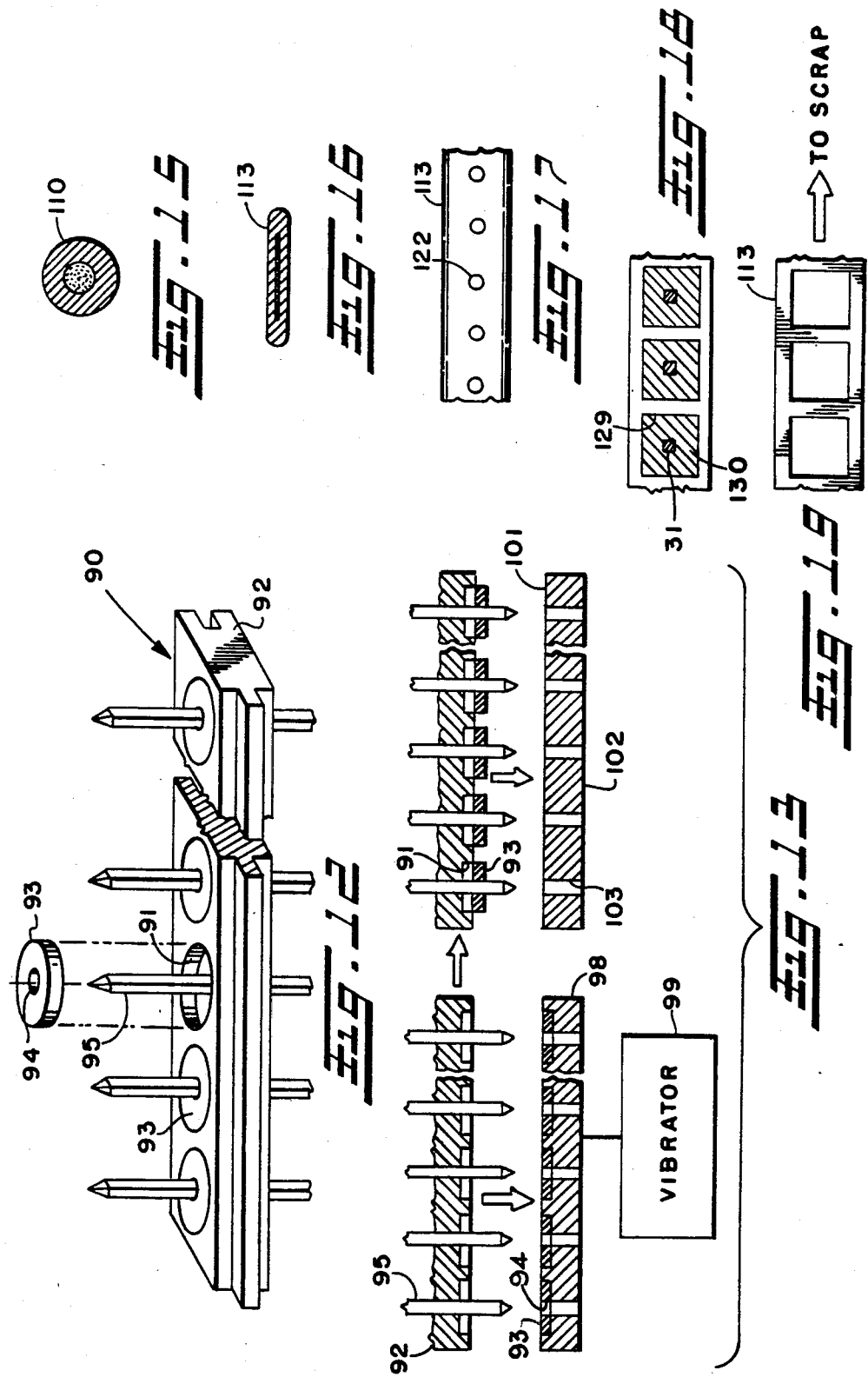

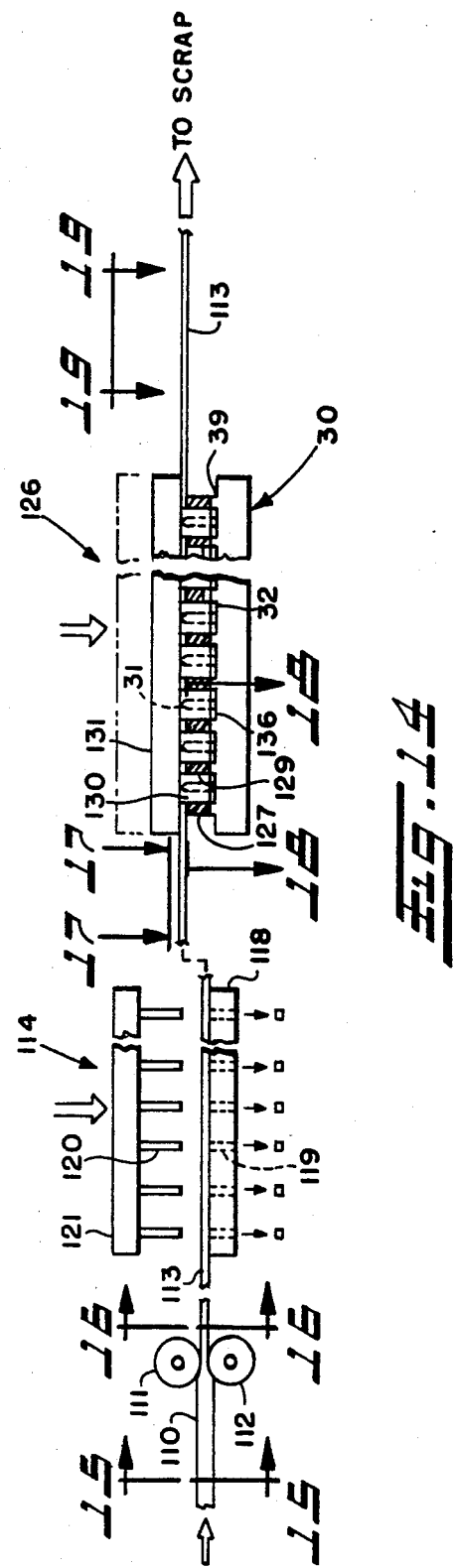

A METHOD AND APPARATUS FOR SURFACE MOUNT COMPATIBLE CONNECTOR SYSTEM WITH MECHANICAL INTEGRITY

RELATED APPLICATIONS

This application is a continuation-in-part of applicants' copending application Ser. No. 747,343, filed June 21, 1985, which is hereby incorporated herein by reference.

This invention relates generally to surface mount electrical component/printed circuit board apparatus and processes and, more particularly, to electrical connectors compatible for use in the manufacturing and operation of surface mount apparatus.

BACKGROUND

Surface mount technology in the field of electronics is that in which electrical components are mounted directly to the surface of a printed circuit board or the like usually without any contacts or leads penetrating through the printed circuit board. Increased space utilization efficiency is an advantage of surface mount technology over space requirements of the prior art techniques for mounting electrical components on a printed circuit board. Thus, surface mount technology provides increased density of components and/or increased capabilities for a given printed circuit board and the like; and surface mount technology also generally reduces the above board height requirements and, therefore, allows more printed circuit boards to be stacked or otherwise positioned in a given electrical apparatus.

In typical surface mount processes a surface mount electrical component is mounted directly to a printed circuit board. More specifically, the printed circuit board may have circuit traces and contact/mounting pads all printed on a surface thereof. A surface mount electrical component, such as a leaded chip carrier, an unleaded component or the like, having plural leads, terminal pads, or the like, is placed on such contact/mounting pads. Solder may have been applied to such leads, terminal pads and/or contact/mounting pads prior to such placement. After all such components are placed on the printed circuit board, heat energy is applied to reflow the solder, such as vapor phase soldering, to complete electrical and mechanical connections between the component(s) and the contact/mounting pads and traces of the printed circuit board. Sometimes an adhesive material is used temporarily to hold the component(s) in position on the printed circuit board prior to and during such soldering.

Consistent with the surface mounting processes currently employed, electrical connectors have been mounted directly to the surface of the printed circuit board in substantially the same way as the other surface mount components are mounted, as is summarized above. In this way complete compatibility of mounting processes is achieved. An example of such an electrical connector is a device known as a header, which is a plurality of electrical contacts retained in relative position by an electrically non-conductive body. Typically such contacts are elongate pin type contacts with ends that are exposed at opposite sides, e.g., the top and bottom, of the body. The exposed contact ends remote from the body are of a shape and are so positioned to fit into electrical and mechanical engagement with the contacts of a portable connector which may be inserted over such contact ends. Such a portable connector may be a female connector having plural female contacts for engaging the male contacts of the header to provide electrical connection of respective circuits, e.g., to the conductors of a cable, another printed circuit board or the like. One or more headers may be mounted in side-by-side fashion to provide multiple rows of exposed header contacts for connection to the contacts of appropriately designed portable connectors and the like.

For consistency with surface mount processes it has become practice to bend the exposed ends of the connector, e.g., header, contacts that are proximate the printed circuit board so that such contact ends can lay flat against the contact/mounting pads of the printed circuit board. Then, during the surface mounting soldering process, securement of those contact ends mechanically and electrically to the surface of the printed circuit board is accomplished in the same way that securement of the other surface mount components is accomplished.

However, such connector surface mounting process lacks certain strength and durability characteristics over prior through-the-board mounting techniques for mounting components on a printed circuit board. Specifically, whenever a portable connector is removed from the header/connector, a substantial force is applied to the connection of the contacts and pads to which they are attached; indeed, such pads themselves are not integral with the printed circuit board but are only an additional layer applied thereto. Thus, there is the possibility that the connection of the header to the printed circuit board and/or the integrity of the pads and printed circuit traces will be too easily damaged or destroyed when mechanically stressed by removing a portable connector from connection with the header connector.

Another disadvantage with the technique of using bent contacts to make connections between a connector mounted on a surface mount printed circuit board and the contact/terminal pads of the latter is the relatively large amount of space required for such contacts and the connections thereof to the printed circuit board. Such space requirement is contrary to one of the important advantages of the surface mount technique vis-a-vis other electrical components designed specifically to be space efficient in the surface mounting process.

SUMMARY OF THE INVENTION

According to the present invention an electrical component that has plural elongate leads or contacts is mountable and/or mounted in a printed circuit board compatibly with surface mount processes by placing the leads or contacts in plated through holes of the printed circuit board and effecting soldering function contemporaneously with the soldering effected during the surface mount soldering process. The leads or contacts in the holes increase the mechanical strength of attachment of the component to the printed circuit board.

According to one aspect of the invention, an electrical component for mechanical mounting and electrical connection with respect to plated through holes of a printed circuit board compatibly with a surface mount attaching process includes an electrically non-conducting body, plural generally elongate contacts extending from the body for insertion into such plated through holes, and the component having a reservoir for retaining solder type material for melting, for flow into respective plated through holes, and for re-solidifying mechanically and electrically to couple the component to such printed circuit board. Preferably the noted reservoir includes solder material for reflowing during the process in which the surface mount components are soldered to the printed circuit board.

According to another aspect of the invention, a method for attaching an electrical component to a printed circuit board compatibly with surface mount attaching processes, such printed circuit board having electrically conductive traces and plated through holes, such component having generally linearly extending contacts and a reservoir of solder type material, includes inserting linearly extending contacts of such component through respective plated through holes while positioning such reservoir of solder type material in proximity to such holes, applying thermal energy to melt such solder type material to flow into such respective holes, and allowing such solder type material to solidify to form a mechanical and electrical connection of respective contacts in respective plated through holes. Such method is particularly useful in automated, e.g., robotic, manufacturing processes.

According to a further aspect of the invention, an apparatus for automatically assembling an electrical component on a printed circuit board compatibly with surface mount attaching processes, such printed circuit board having plated through holes, and such component having generally elongate contacts adapted to be placed into such holes and a reservoir of solder type material for mechanically and electrically attaching respective contacts at respective holes, includes a holder for holding a plurality of such components in stacked relation, a slider for sliding a component from such holder into an accessible pick up position, and a robotic device for picking up such component, transferring such component to a printed circuit board, and inserting such contacts into such holes with such solder type material placed in proximity to such holes.

In one embodiment the electrical component is a header having plural elongate parallel pin type contacts held in an electrically non-conductive body. The pins are inserted through plated through holes in the printed circuit board, e.g. using robotics while leaving some space between respective pins and hole walls. A supply of solder type material about each pin and at least partly in a recess forming a reservoir in the body is meltable to fill up space left in each hole thus providing both mechanical securement and electrical connection between the contacts and the holes. Such recesses may be formed by respective pairs of stand off protrusions on the header body that prevent the main part of the body from directly engaging the surface of the printed circuit board and/or provide other functions, as is described further below. The mechanical and electrical integrity of such connector/printed circuit board connection ordinarily is at least as good and preferably better than is achieved using the prior bent contact surface mount attachment technique summarized above; and the technique of the invention also minimizes the amount of space required on the printed circuit board for attaching the header connector thereto. Furthermore, since there is no need for bent contacts, the additional height above board requirement therefor is eliminated, this being further consistent with the philosophy of surface mount technology.

According to still another aspect of the invention, a method of manufacturing an electrical component including an electrically non-conducting body, plural generally elongate contacts extending from the body for insertion into plated through holes in a printed circuit board, and the component having reservoirs for retaining solder type material for melting, for flow into respective plated through holes, and for re-solidifying to mechanically and electrically couple the component to such printed circuit board, comprises the step of pushing formed slugs of solder type material along respective contacts and into respective reservoirs. More particularly, solder preforms having a donut shape are pre-positioned and then simultaneously placed on respective contacts and seated in respective reservoirs. According to a more preferred method, solder cord is flattened to form a generally flat solder ribbon which at a first station has holes punched therein at the same center-to-center spacing as the contacts in the component body, such holes being sized to closely receive the contacts therein. At a second station, cutting elements shear slugs of solder from the solder ribbon and then push the sheared solder slugs into respective reservoirs of the component body.

Further in accordance with the invention, a punch and die apparatus for placing solder type material into respective reservoirs of the electrically non-conducting body of an electrical component including plural generally elongate contacts extending from the body for insertion into plated through holes in a printed circuit board, such reservoirs retaining the solder type material for melting, for flow into respective plated through holes, and for re-solidifying to mechanically and electrically couple the component to such printed circuit board, comprises a punch for shearing a solder slug from a generally flat ribbon of solder and then inserting the solder slug into a respective reservoir of the component body. More particularly the apparatus includes a backing plate for supporting the solder ribbon at a surface thereof, the backing plate including at least one hole opening to such surface, the hole corresponding in shape to the solder slug, and a cutting edge adjacent the hole; and a cutting element aligned with the hole for passage therethrough, the cutting element having a cutting edge cooperative with the cutting edge of said backing plate to shear the slug from the solder ribbon as the cutting element is moved into the hole, the cutting element passing sufficiently into the hole to push the sheared solder slug into a respective reservoir of the component body positioned with respect to a side of the backing plate opposite such surface thereof.

These and other objects and advantages of the present invention will become more apparent as the following description proceeds.

To the accomplishment of the foregoing and related ends, the invention, then, comprises the features herein described and particularly pointed out in the claims, the following description and the annexed drawings setting forth in detail a certain illustrative embodiment of the invention, this being indicative, however, of but one of the various ways in which the principles of the invention may be suitably employed.

BRIEF DESCRIPTION OF THE DRAWINGS

In the annexed drawings:

FIGS. 1A and 1B are views of a prior art surface mounted connector on a printed circuit board respectively depicting a header so mounted and an enlargement of one of the header's bent contacts showing the forces applied during removal of a portable connector;

FIG. 2 is an isometric view of a printed circuit board with electrical components in the form of headers mounted thereon in accordance with the present invention with other surface mount components the stand offs on the header bodies are not shown in this figure for facility and clarity;

FIGS. 3 and 4 are, respectively, top and bottom isometric views of a header connector component in accordance with the present invention;

FIG. 5 is an enlarged fragmentary isometric view of a pin contact of the header connector component in accordance with the present invention;

FIG. 6 is an enlarged fragmentary section view of a plated through hole of the printed circuit board of FIG. 2;

FIG. 7 is a top view of the plated through hole of FIG. 6 looking generally in the direction of the arrows 7—7 of FIG. 6;

FIG. 8 is an enlarged fragmentary section view of the header positioned in the printed circuit board prior to soldering;

FIG. 9 is an enlarged fragmentary section view of the header positioned in the printed circuit board after soldering;

FIG. 10 is a schematic view of an automated machine for placing surface mount components in a printed circuit board;

FIG. 11 is a schematic view of a vapor phase solder environment in which soldering of surface mount and connector components according to the invention may be carried out.

FIG. 12 is a fragmentary isometric view of a modified header according to the invention, which employs solder preforms in reservoirs, one being shown in exploded relation to a reservoir;

FIG. 13 is a schematic sectional view through apparatus for assembling the solder preforms with the header;

FIG. 14 is a schematic view, partly in section and partly in elevation, of other apparatus operative to punch solder slugs from solder car and effect placement of such slugs in the reservoirs; and FIG. 15-19 are sectional or elevational views taken as looking from the lines 15—15, 16—16, 17—17, 18—18 and 19—19, respectively.

PRIOR ART

Briefly referring to FIGS. 1A and 1B, a printed circuit board 1 on which surface mount components are to be mounted and on which an electrical connector 2 in the form of a header 3 with bent contacts 4, 5 is illustrated. The printed circuit board 1 has plural printed circuit traces 6, 7 printed or otherwise formed on the surface 8 thereof, each preferably having one or more mounting pads 10, 11, sometimes called solder pads electrically connected therewith and on which a surface mount component may be mounted and electrically connected. The header 3 is formed of a body 12 of electrically non-conductive material that preferably is molded about a portion of each of the contacts 4, 5 to hold the same in the parallel alignment shown at available contacting portions 13 while also maintaining the bent contact ends 4, 5 in position to be attached to respective pads 10, 11.

With the header 3 in position on the printed circuit board 1 the header and other surface mount components may be vapor phase or otherwise soldered in place. The relatively large amount of space required by the contacts 4, 5 on the surface 8 of the printed circuit board 1 is evident from FIGS. 1A and 1B; to avoid breaking the contacts 4, 5 it is necessary that the curvature thereof be somewhat gradual and, therefore, more space consuming. In FIG. 1B the force applied to the contact 4 of the header 3 is represented generally by the vector 14 which can be resolved to a substantial vertical force concentration that tends to tear at the solder 15 in a direction in which there is a weakness in the solder, e.g. the solder is thin and there is minimal grasping force of the contact 4 in such direction, and in the pad 10 and a horizontal force component. Indeed, such tearing action can too easily damage the integrity of the connection between the contact 4 and the pad 10 and possibly also can damage the integrity of the pad vis-a-vis connection to the surface 8.

DESCRIPTION OF THE PREFERRED EMBODIMENT

Referring now in detail to the drawings showing the invention and wherein like numerals designate like parts in the several figures and initially to FIG. 2, a printed circuit board 20 having a single header 21 and a pair of parallel headers 22 and 23 mounted thereon is illustrated. Also mounted on the printed circuit board surface 24 are several surface mount electrical components 25, such as leaded or unleaded chip carriers, etc.

The fundamental components of the invention, such as an electricl component in the form of the header 21, of the invention include an electrically non-conductive body 30, one and preferably a plurality of electrical leads 31 supported by or protruding from such body, and a reservoir 32 formed in the body for retaining or helping to retain a quantity of solder or solder type material 33, all of which are illustrated in FIGS. 3 and 4. Moreover, the invention also relates to respective plated through holes 34 (FIG. 6) through the printed circuit board 20 and through which respective electrical leads 31 pass to complete a connection of a header to the printed circuit board.

The body 30 is of electrically non-conductive material capable of withstanding the temperatures and other environmental conditions experienced during the process by which the surface mount components are secured to the printed circuit board, e.g., during a vapor phase soldering process, etc. Such temperatures and environmental conditions may be more severe than those experienced in the past using conventional wave soldering techniques wherein the heat of the solder wave usually is kept remotely from the components, i.e. on the opposite side of the printed circuit board from the component.

Preferably the body 30 is of rectangular cross section having top and bottom surfaces 35 ad 36 through which the leads, in the form of pin contacts 31, protrude or extend, and side surfaces 37 and 38. In the bottom surface 36 are the reservoirs 32 within which the solder supply 33 is retained. The reservoirs 32 are recesses formed between respective pairs of standoff protrusions 39 that extend from the surface 36, such reservoirs, then, generally circumscribing the areas where the respective pin contacts protrude out from the surface 36. Alternatively, the reservoirs may be formed of raised ring-like or other shape walls and/or recesses formed on the bottom surface 36 of the body 30.

To facilitate automated handling of the headers 21, 22 and 23 (FIG. 2) the side surfaces 37 and 38 preferably are of a shape that permits one surface to slide along the other. More specifically, the surfaces 37 and 38 are generally smooth except for a groove 40 formed in the surface 37 and a flange, tab or tongue 41 formed in the surface 38. The tab of one header may slide in the groove of an adjacent one to facilitate the mentioned automated handling, as is described further below. Such tab and groove arrangement also may help to secure the two headers 22 and 23 (FIG. 2) with respect to each other to reinforce their retention on the printed circuit board 20.

The pin contacts 31 preferably are elongate, most preferably they are straight, although special curvature at appropriate locations may be included, if desired, for example to help retain the same in the body 30 or for other mechanical or electrical connection purpose. The pin contacts 31 extend beyond the top of the header body 30 a distance adequate to facilitate secure attachment to respective female contacts or the like thereto, as is shown at 31T, and the pin contacts 31 extend beyond the bottom of the header an adequate distance to pass through the plated through holes 34, as is shown at 31B. The cross section of the pin contacts or leads 31 may be rectangular, for example square; alternatively, they may be generally circular. A rectangular cross section, though, ordinarily provides greater strength than round cross section. It will be appreciated that since the pin contacts do not have to bend to the extent that the leads 4 and 5 (FIG. 1A) are bent, such pin contacts 31 do not have to be as long as those leads 4 and 5, thus further reducing cost and importantly reducing space requirements in directions parallel to the plane of the printed circuit board 20 and through the printed circuit board.

In FIGS. 6 and 7 the plated through holes 34 are shown. Such holes are through the printed circuit board 20, are plated, and preferably are coupled electrically to printed circuit traces 51 on the printed circuit board in usual manner. The relation of the cross sectional size or dimension of the plated through holes to that of the pin contacts is such that will minimize, indeed preferably will avoid any, insertion forces of the pin contacts 31 into the board 20 and facilitate pin to hole alignment during manufacturing, which may be particularly advantageous when using automated, e.g., robotic, manufacturing techniques. The noted cross sectional relation is such that there is at least some space between part of the faces 52 of the pin contacts 31 and the sides 53 of the holes. Such space 54 is provided to permit the flow of solder therein, e.g. when the solder type material 33 is reflowed during the surface mount process.

Placement of the header 21 in the printed circuit board 20 is shown in enlargement in FIGS. 8 and 9, the former before soldering and the latter afterwards. The bottom end of the pin contact 31 is inserted into the plated through hole 34 to such extent that preferably the solder supply 33 is in engagement with the printed circuit board top surface or with the trace printed thereon. On one hand, the recessed area in the header body 30 between standoffs provides the reservoir 32 and allows a relatively large amount of solder, in any event the amount needed to complete a secure soldering process while permitting the body to be positioned rather close to the top surface of the printed circuit board to minimize height above board requirements and to maximize strength parameters. On the other hand, the stand-offs provide space above board to permit cleaning of the board surface to remove residual flux from the solder surfaces. The open area between stand-offs also may improve heat penetration to the solder supply to melt the same, and to assure melted solder flows to proper locations, i.e., down the hole and to form the desired meniscus 55 and meniscus 56, as is seen in FIG. 9, without causing any short circuiting to other pin contacts, printed circuit traces, etc., the stand-offs 39 themselves also may help prevent short circuiting between adjacent pin contacts 31 and of the circuits to which they may be connected.

The solder supply 33 may be an electronic solder paste, such as that sold by Alpha Metals Inc., Jersey City, N.J., U.S.A. that can be placed in the reservoirs between respective stand offs 39, for example by using a syringe type device. Such solder paste may be cured in usual fashion e.g. by heat to prevent the same from being sticky and, thus, to facilitate shipping and handling and to extend shelf life.

Summarizing installation of the header 21 in the printed circuit board 20, the header pin contacts 31 are inserted into respective plated-through holes. The solder supply 33 in each reservoir 32 is heated, melts and by capillary action, gravity, etc., flows into the space 54 and then solidifies.

In FIG. 9 the reflowed solder 57 can be seen filling the space 54 and also forming the meniscus 55 at the top of the printed circuit board and preferably also forming a further meniscus 56 at the bottom of the hole in the printed circuit board. Each meniscus helps to assure effective electrical connection, provides some degree of compliance factor as parts mechanically are bent, stressed, etc., and tends to maintain cleanliness of the areas where the majority of the pin contacts, plating in the plated through holes, and solder engaged with both of the latter are mechanically and electrically coupled. Preferably the quantity of the solder supply 33 in each reservoir 32 is adequate when reflowed to fill the space 54 and to form the menisci 55, 56 extending along the pin contact 31 beyond the plane of the bore 20 at the top and bottom surfaces thereof for the aforementioned reasons, i.e., to achieve the above advantages of the invention. Too little solder may result in the space 54 not being filled and/or one or both of the menisci being too short or even recessed within the hole 34. The aforementioned reflowing of the solder may be achieved using vapor phase soldering or other technique employed for surface mount electrical and mechanical attachment processes vis-a-vis surface mount electrical components and printed circuit boards or the like intended to carry the same.

An important advantage to the aforementioned solder supply 33 and reservoir 32 therefor is that since the solder material is provided in a reservoir on the connector or other electrical component, i.e. the header 21, rather than as a coating or layer on the pin contact or on the plating of the plated through hole, the possibility of scraping away the solder during insertion of the pin contact into the hole is avoided. Moreover, such reservoir of solder preferably permits adequate amount thereof to be carried for filling the space 54 for strength and integrity of the mechanical and electrical connections to be made.

An automated apparatus for assembling printed circuit boards with surface mount components is shown schematically at 70 in FIG. 10. Such machine includes a support 71 for a printed circuit board, with conventional alignment mechanism for placing, loading, and/or holding the board 2 in proper alignment. An exemplary support for the board 20 is shown at 72. The machine 70 also includes a supply 74 of surface mount components and/or other electrical and electronic components, a robotic mechanism 75, such as a robotic arm with appropriate movement and retention capabilities, and a controller 76. The controller 76 may be a computer control device of conventional design programmed in conventional manner to operate the supply 74 to provide surface mount components for pick up and delivery to the printed circuit board 20 by the robotic arm 75 and, of course, also to operate such arm. Such apparatus may be generally of the type that is employed in automated surface mount manufacturing processes, and operation of such apparatus may be generally as is conventional for such apparatus as used in surface mount manufacturing processes.

The supply 74 includes, for example, a supply of conventional surface mount components, such as PLCC (plastic leded chip carrier) and/or other devices in a holder, all generally designated 77, and a further holder 78 for containing a supply of a plurality of headers 21 in stacked relation. Associated with the holder 78 is a pusher 79 for pushing a header 21 out from between guides 80 along a table 81 into position for pick up by the arm 75 both under operative control of the controller 76. Since the side surfaces of the header bodies 30 are smooth or in any event designed to slide over each other and especially in view of the tab 40 and groove 41 configuration thereof, such sliding in an accurately determined manner can be accomplished to facilitate use with and positioning by the automated apparatus 70. Thus, upon being picked up by the robotic arm 75, the header may be conveniently rotated by the arm and is placed properly in the plated through holes provided therefor in the printed circuit board 20.

Briefly referring to FIG. 11, the assembled printed circuit board 20 with several surface mount electrical components, such as PLCC and header/connector devices, positioned thereon is shown placed in a heated environment 82 in which vapor phase soldering of such components and printed circuit board can be accomplished in conventional manner. During such soldering, solder already pre-placed on the printed circuit board and/or on the components (ordinarily except for the header or other components that are to be secured to the printed circuit board in the manner described in detail above with respect to the header 21) will be reflowed to complete mechanical and electrical connections. Also during such soldering the solder supply 33 will reflow in the manner described above to complete the connections shown in detail in FIG. 9. It will be appreciated that if desired there may be a pre-placement of solder at the plated through holes 34 and/or on the pin contacts 31 while realizing that some of such solder likely would be pushed out or scraped off when the pin contacts 31 are pushed into the holes. It also will be appreciated that other surface mount components may be mechanically and electrically connected to a printed circuit board in the manner described with respect to the header 21 while still maintaining the space efficiency aspects of surface mount technology and processes.

In view of the foregoing, it will be appreciated that the invention may be used to secure mechanically and electrically electrical components, such as connectors, more particularly headers, and the like to printed circuit boards or other surfaces or supports for such components in a way that is compatible with surface mount processes and while maintaining the space utilization efficiency offered by surface mount technology.

In FIG. 12, a modified form of header is shown at 90. The reservoirs 91 formed in the header body 92 are circular for receipt of solder slugs or, more particularly, solder preforms 93 having a donut-like shape. The solder preforms 93 each have a center hole 94 for receiving a respective pin contact 95 of the header, an outer diameter generally conforming to the diameter of the reservoir, and a height generally about equal the depth of the reservoir. The size of the solder preform is selected to provide the amount of solder needed to complete a secure soldering process as in the aforedescribed manner.

FIG. 13 schematically shows a method and apparatus for assembling the solder preforms 93 with the header body 92 in an automated and efficient manner. According to such method, solder preforms may be placed atop a parts locating plate 98 which is vibrated by vibrator apparatus 99 to cause the solder preforms to drop into locating holes 100 arranged in a pattern corresponding to the pattern of reservoirs 91 in the header body. The header body 92 then is placed over the plate 98 as seen at the left in FIG. 13 and moved towards the plate to insert the pin contacts 95 through the therewith aligned center holes 94 of the solder preforms. The diameter of the center holes preferably is slightly smaller than the diagonal cross-sectional dimension of the respective pin contacts so that when the header body is thereafter pulled away from the the locating plate, the solder preforms will be carried on the pin contacts. In a second operation seen at the right in FIG. 13, the header body may be placed over and pushed against the planar surface 101 of a seating plate 102 having holes 103 into which the pin contacts pass. As the bottom surface of the header body is brought against the surface 101 of the plate, the solder preforms will be forced into and fully seated in the reservoirs 91.

FIGS. 14–19 schematically illustrate a method and apparatus for placing solder in the reservoirs 32 of the header body 30, i.e., between the stand-off protrusions 39. Going from left to right in FIG. 14, electronic solder rope 110 of the paste resin acid core type, or the like, is rolled generally flat as by passing the solder rope between a pair of spaced rollers 111 and 112 to form a generally flat solder strip or ribbon 113. The solder ribbon 113, which may be about 0.015 inch thick and about 0.125 inch wide, is then placed in a first staitonw-punch and die apparatus 114.

The apparatus 114 includes a backing plate 118 for the solder ribbon 113, such backing plate including at least one hole 119 sized to accomodate with a close fit a reciprocating cutting element 120 included in a punch head 121. The punch head preferably is provided with a plurality of such cutting elements 120 arranged in a pattern corresponding to the pattern of pin contacts 31 in the header body 30, i.e., in a row at the same center-to-center spacing as the header pin contacts. Each cutting element coacts with the backing plate to punch a hole 122 in the solder ribbon 113, each hole 122 having a shape and size for receiving a respective pin contact preferably with a slight interference fit. Each hole 122, for example, may be about 0.030 inch in diameter for a 0.025 inch square pin contact.

After the holes 122 have been punched in the solder ribbon at the same center-to-center spacing as the pin contacts in the header body, the solder ribbon 113 is advanced to a second station punch and die apparatus 126. The apparatus 126 includes a die plate 127 having a planar top surface and at least one guide hole 129 corresponding in cross-section to the shape of the reservoirs 32 in the header body 30. As is preferred, the die plate includes a plurality of such guide holes 129 arranged in a pattern corresponding to the pattern of the reservoirs in the header body which is placed and held beneath the die plate with the pin contacts extending into respective guide holes 129. Also, the holes 122 in the solder ribbon are then aligned with respective pin contacts in the header body.

Aligned with each guide hole 129 is a reciprocating cutting element 130 included in a punch head 131 for movement into and out of the respective guide hole. The end face of each cutting element forms with its sides a peripheral cutting edge that cooperates with a cutting edge at the periphery of the guide hole to shear a solder slug 136 from the solder ribbon 113 as the cutting element is urged into the guide hole, each solder slug including interiorly thereof a respective hole 122. Each cutting element also has a center axial hole opening to its end face to accomodate the pin contact during the punching operation.

After the solder slugs 136 have been sheared from the solder ribbon 113, continued descent of the cutting elements 130 pushes the solder slugs down over the pin contacts and into seated engagement with the reservoirs 32. Accordingly, such shearing and seating of the solder slugs is performed simultaneously with each downward stroke of the cutting elements. At this point, the completed header may be removed from the apparatus 126 and a new header completed in like manner as in a repetitive sequential process.

What is claimed is:

1. A method of manufacturing an electrical component including an electrically non-conducting body, plural generally elongate contacts extending from the body for insertion into plated through holes in a printed circuit board, and the component having reservoirs for retaining solder type material for melting, for flow into respective plated through holes, and for re-solidifying to mechanically and electrically couple the component to such printed circuit board, said method comprising the step of pushing formed slugs of solder type material along respective contacts and into respective reservoirs.

2. The method of claim 1, wherein each formed slug has a hole therein for passage of the contact therethrough.

3. The method of claim 2, wherein each formed slug is of donut-shape.

4. The method of claim 1, further comprising the step of punching the formed slugs from a generally flat ribbon of solder.

5. The method of claim 4, further comprising the step of flattening solder cord to form the generally flat ribbon of solder.

6. The method of claim 5, further comprising the step of punching plural holes in the ribbon of solder at the same center-to-center spacing as the contacts on the body, and then aligning such holes with respective contacts in the body prior to punching the solder slugs from the ribbon.

7. The method of claim 4, including shearing each solder slug from the ribbon by a respective cutting element and then using such cutting element to push the solder slug into the respective reservoir.

8. The method of claim 1, wherein a plurality of the formed slugs are simultaneously pushed along respective contacts and into respective reservoirs.

9. The method of claim 1, including the steps of placing the formed slugs atop a parts locating plate and then vibrating the plate to cause the formed slugs to drop into locating holes in the plate.

10. A punch and die apparatus for placing solder type material into respective reservoirs of the electrically non-conducting body of an electrical component including plural generally elongated contacts extending from the body for insertion into plated through holes in a printed circuit board, such reservoirs retaining the solder type material for melting, for flow into respective plated through holes, and for re-solidifying to mechanically and electrically couple the component to such printed circuit board, said apparatus comprising punch means for shearing a solder slug from a generally flat ribbon of solder and then inserting the solder slug into a respective reservoir of the component body.

11. The apparatus of claim 10, comprising backing means for supporting the solder ribbon at a surface thereof, said backing means including at least one hole opening to said surface, said hole corresponding in shape to the solder slug, and a cutting edge adjacent the hole; and cutting means aligned with said hole for passage therethrough, said cutting means having a cutting edge cooperative with the cutting edge of said backing means to shear the slug from the solder ribbon as said cutting means is moved into said hole, said cutting means passing sufficiently into said hole to push the sheared solder slug into a respective reservoir of the component body positioned with respect to a side of the backing means opposite said surface thereof.

* * * * *